(12) United States Patent
Yeong et al.

(10) Patent No.: US 10,971,627 B2
(45) Date of Patent: Apr. 6, 2021

(54) SEMICONDUCTOR STRUCTURE AND MANUFACTURING METHOD

(71) Applicant: TAIWAN SEMICONDUCTOR MANUFACTURING COMPANY, LTD., Hsinchu (TW)

(72) Inventors: Sai-Hooi Yeong, Zhubei (TW); Chi On Chui, Hsinchu (TW); Yu-Ming Lin, Hsinchu (TW); Chih-Hao Wang, Baoshan Township (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 47 days.

(21) Appl. No.: 16/236,225

(22) Filed: Dec. 28, 2018

(65) Prior Publication Data
US 2020/0105935 A1    Apr. 2, 2020

Related U.S. Application Data

(60) Provisional application No. 62/737,551, filed on Sep. 27, 2018.

(51) Int. Cl.
*H01L 29/78*      (2006.01)
*H01L 29/423*     (2006.01)
(Continued)

(52) U.S. Cl.
CPC .... *H01L 29/7851* (2013.01); *H01L 21/28088* (2013.01); *H01L 21/28518* (2013.01);
(Continued)

(58) Field of Classification Search
CPC ............ H01L 29/7851; H01L 29/4236; H01L 29/4966; H01L 21/28088; H01L 21/28518;
(Continued)

(56) References Cited

U.S. PATENT DOCUMENTS 6,271,095 B1 * 8/2001 Yu .................... H01L 29/66492
                                              257/E21.437
9,548,250 B1 * 1/2017 Basker ................ H01L 21/845
(Continued)

*Primary Examiner* — Mouloucoulaye Inoussa
(74) *Attorney, Agent, or Firm* — Birch, Stewart, Kolasch & Birch, LLP

(57) ABSTRACT

Aspects of the disclosure provide a semiconductor device. The semiconductor device includes a gate structure, a spacer structure and a source/drain structure that are formed on a surface of the semiconductor layer. The gate structure includes a dielectric structure, a metal structure and an insulator structure. The dielectric structure is formed on the surface of the semiconductor layer. A bottom of the metal structure contacts a top of the dielectric structure. The bottom of the insulator structure contacts a top of the metal structure and the insulator structure protrudes over the top of the metal structure. The spacer structure is configured to extend underneath the bottom of the insulator structure and contact a sidewall of the metal structure. The spacer structure is configured to space between the gate structure and the source/drain structure. The source/drain structure includes a source/drain doped structure, a silicide structure and a metal contact plug.

20 Claims, 14 Drawing Sheets

(51) Int. Cl.
  *H01L 29/49*    (2006.01)
  *H01L 21/28*    (2006.01)
  *H01L 21/285*   (2006.01)
  *H01L 21/768*   (2006.01)
  *H01L 21/308*   (2006.01)
  *H01L 29/66*    (2006.01)

(52) U.S. Cl.
  CPC .... *H01L 21/3086* (2013.01); *H01L 21/76897* (2013.01); *H01L 29/4236* (2013.01); *H01L 29/4966* (2013.01); *H01L 29/66795* (2013.01)

(58) Field of Classification Search
  CPC ........... H01L 21/76897; H01L 21/3086; H01L 29/66795; H01L 27/0886; H01L 29/42372; H01L 29/785; H01L 29/66545; H01L 29/66666; H01L 29/517; H01L 27/0922; H01L 29/0649; H01L 29/42376; H01L 29/42364; H01L 21/28556; H01L 21/321; H01L 29/78; H01L 29/401

USPC .. 257/401, 369, 392, 288, E21.19, E29.255; 438/586, 589, 595, 592

See application file for complete search history.

(56) References Cited

U.S. PATENT DOCUMENTS

| | | | |
|---|---|---|---|
| 9,852,947 B1* | 12/2017 | Ko | H01L 21/76802 |
| 10,037,915 B1* | 7/2018 | Hsu | H01L 21/823418 |
| 2008/0261385 A1* | 10/2008 | Jawarani | H01L 29/7843 438/517 |
| 2012/0086056 A1* | 4/2012 | Beyer | H01L 21/31111 257/288 |
| 2016/0079243 A1* | 3/2016 | Kim | H01L 21/823475 257/369 |
| 2017/0084722 A1* | 3/2017 | Lu | H01L 29/785 |

* cited by examiner

SEMICONDUCTOR STRUCTURE AND MANUFACTURING METHOD

INCORPORATION BY REFERENCE

This present disclosure claims the benefit of U.S. Provisional Application No. 62/737,551, "SEMICONDUCTOR STRUCTURE AND MANUFACTURING METHOD" filed on Sep. 27, 2018, which is incorporated herein by reference in its entirety.

BACKGROUND

The semiconductor integrated circuit (IC) industry has experienced rapid growth. The introduction of gate stack materials, such as high dielectric constant (high-k) gate insulator layers, metal gate (MG) electrode, and the like has enable the resumption of Moore's law as technology nodes shrink. The high-k/MG gate stack materials can be integrated in a gate-first process or a gate-last process. In a gate-first process, the gate structure is formed before a formation of the source-drain structure. In a gate-last process, the gate structure is formed after a formation of the source-drain structure.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
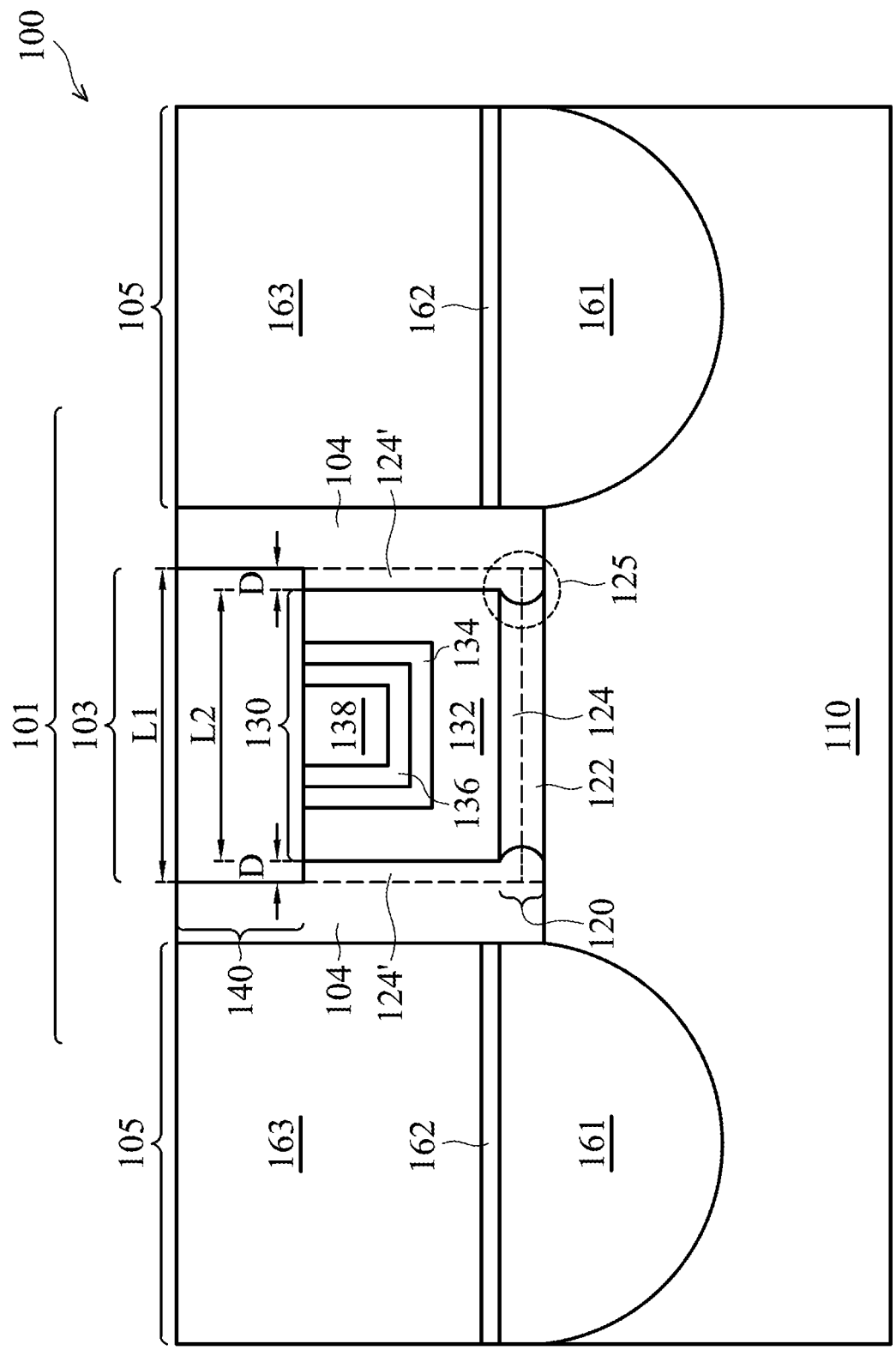
FIG. 1 shows a longitudinal cross sectional view of a transistor 101 in a semiconductor device 100 in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Aspects of the disclosure provide a gate-first process that forms mandrel structures of reversed gate patterns, thus recess portions that are surrounded by the mandrel structures are of the gate patterns. Then, the gate-first process utilizes process steps that are similar to gate-last metal fill process steps to form the gate structures at the recess portions. After the formation of the gate structures at the recess portions, the mandrel structures are removed, and then the gate-first process continues to form spacer structures and to form the source/drain structures. Accordingly, in an example, the gate-first process achieves the benefit of the gate-last metal fill advantages, such as straighter gate profile, dual metal patterning, no metal etching and the like. In addition, in some embodiments, the gate-first process allows a self-aligned formation of source/drain structures. In some embodiments, the mandrel structures have relatively large aspect ratio compared to a related gate-last example that uses mandrel structures of gate patterns, thus mandrel structure bending and collapse issues are of less concern in the present disclosure.

FIG. 1 shows a cross sectional view of a semiconductor device 100 that is fabricated by a gate-first process in accordance with some embodiments.

The semiconductor device 100 refers to any suitable device, for example, one or more transistors, integrated circuits (e.g., memory circuits and/or logic circuits), a semiconductor chip (or die) with integrated circuits formed on the semiconductor chip, a semiconductor wafer with multiple semiconductor dies formed on the semiconductor wafer, a stack of semiconductor chips, a semiconductor package that includes one or more semiconductor chips assembled on a package substrate, and the like.

In the FIG. 1 example, the semiconductor device 100 includes a transistor 101 formed in an active region on a semiconductor layer 110. The transistor 101 includes a gate structure 103, source/drain (SD) structures 105 and spacer structures 104 between the gate structure 103 and the SD structures 105.

In an example, the semiconductor layer 110 includes an elementary semiconductor, such as silicon or germanium in crystal, polycrystalline, or an amorphous structure. In another example, the semiconductor layer 110 includes a compound semiconductor, such as gallium arsenic, gallium phosphide, silicon carbide, indium phosphide, indium arsenide, and/or indium antimonide. In another example, the semiconductor layer 110 includes an alloy semiconductor, such as SiGe, GaAsP, AlGaAs, AlInAs, GaInAs, GaInP, and/or GaInAsP. In some embodiments, the semiconductor layer 110 has a fin structure, and the transistor 101 is referred to as a fin field effect transistor (FinFET).

Figure 2:
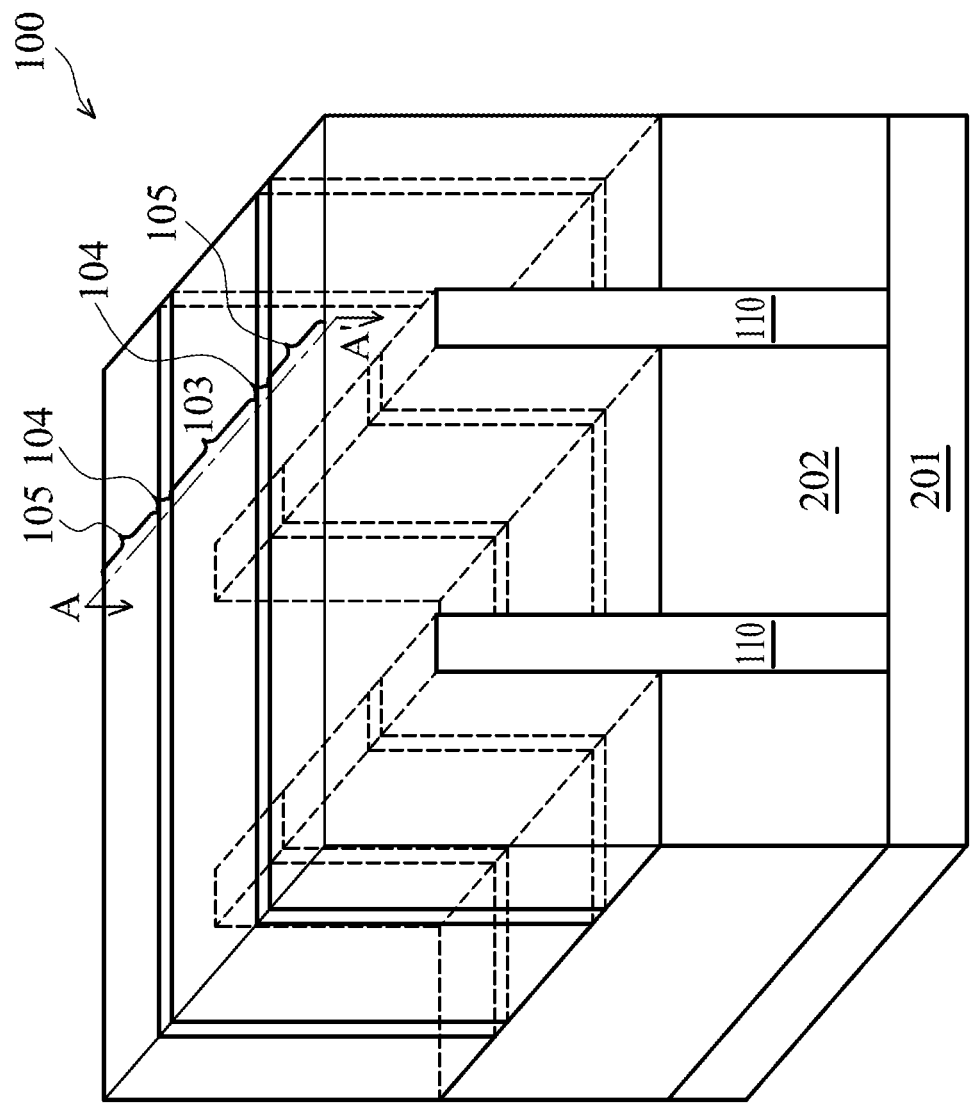
FIG. 2 shows a perspective view of the semiconductor device 100 in accordance with some embodiments.

FIG. 2 is a perspective view of the semiconductor device 100 in accordance with some embodiments. The semiconductor device 100 includes a substrate 201 with semiconductor fins 110 disposed above the substrate 201. In some embodiments, the substrate 201 is an insulating layer, and the semiconductor fins 110 are partially embedded in the insulating layer. In some examples, the substrate 201 is semiconductor substrate with the semiconductor fins 110 that are formed on the substrate 201. The semiconductor fins 110 are separated by an isolation structure 202, such as shallow trench isolation (STI), and the like. The semiconductor fin 110 can be formed of any suitable semiconductor material, such as silicon, silicon-germanium, germanium, and the like. The gate structure 103 is formed over a top surface and sidewalls of the semiconductor fin 110. In some examples, spacer structures 104 and the SD structures 105 are also formed over the top surface and sidewalls of the semiconductor fin 110. Thus, the channel of the transistor 101 is defined along the top surface and sidewalls of the semiconductor fin 110, and is extended between SD structures 105 in the semiconductor fin 110. FIG. 1 corresponds to a cross sectional view of the semiconductor fin 110 along a line A-A' in an embodiment.

Referring back to FIG. 1, the gate structure 103 includes a dielectric structure 120, a metal gate (MG) electrode structure 130 (also referred to as metal structure in some examples) and a self-aligned contact (SAC) hard mask structure 140 (also referred to as insulator structure in some examples).

The dielectric structure 120 includes one or more gate insulator layers. In some embodiments, at least one of the gate insulator layers has a relative large dielectric constant, such as higher than 3.9 (silicon dioxide dielectric constant), and is referred to as high-k dielectric layer. In the FIG. 1 example, the dielectric structure 120 includes an interfacial layer 122 that is formed on the surface of the semiconductor layer 110, and a high-k dielectric layer 124 that is formed between the interfacial layer 122 and a bottom of the MG electrode structure 130. Initially, the high-k dielectric layer 124 is formed to have a U-shape that includes vertical portions 124' that are in direct contact with sidewalls of the MG electrode structures 130. The vertical portions 124' are etched away in an etching process and are subsequently replaced with spacer material in a spacer deposition step.

In some embodiments, the interfacial layer 122 is formed to provide high quality interface (e.g., $SiO_2$/Si interface). In an embodiment, the interfacial layer 122 is thermally oxidized and grown dielectric (e.g., silicon dioxide), and is formed on the exposed surface of the semiconductor layer 110. In another embodiment, the interfacial layer 122 is formed by deposition, such as atomic layer deposition (ALD), chemical vapor deposition (CVD), and the like, thus the interfacial layer 122 initially has the U shape and vertical portions of the U shape are then etched away, in a similar manner as the high-k dielectric layer 124.

In some embodiments, the high-k dielectric layer 124 is configured to have a relatively large dielectric constant compared to silicon dioxide. The high-k dielectric layer 124 can include any suitable material that provide the relatively large dielectric constant, such as hafnium oxide ($HfO_2$), hafnium silicon oxide ($HfSiO_4$), hafnium silicon oxynitride (HfSiON), aluminum oxide ($Al_2O_3$), lanthanum oxide ($La_2O_3$), tantalum oxide ($Ta_2O_5$), yttrium oxide ($Y_2O_3$), zirconium oxide ($ZrO_2$), strontium titanate oxide ($SrTiO_3$), zirconium silicon oxide ($ZrSiO_4$), hafnium zirconium oxide ($HfZrO_4$), strontium bismuth tantalate ($SrBi_2Ta_2O_9$, SBT), lead zirconate titanate ($PbZr_xTi_{1-x}O_3$, PZT), and barium strontium titanate ($Ba_xSr_{1-x}TiO_3$, BST), where x is between 0 and 1. The high-k dielectric layer 124 can be formed using any suitable deposition process, such as ALD, CVD, metalorganic CVD (MOCVD), physical vapor deposition (PVD), plasma enhanced CVD (PECVD), plasma enhance ALD (PEALD), thermal oxidation, combinations thereof, or other suitable technique.

The MG electrode structure 130 includes multiple metal layers, such as a metal barrier layer, a work function layer, a metal filling layer, and the like. In the FIG. 1 example, the MG electrode structure 130 includes a metal barrier layer 132, work function metal layers 134-136 and a metal filling layer 138.

The metal barrier layer 132 is configured to conduct electricity and prevent inter-diffusion and reaction between metals, silicon or dielectric materials. The metal barrier layer 132 has a U-shape at the longitudinal cross-section (e.g., along line A-A') of the transistor 101, and forms a metal barrier recess that is surrounded by the metal barrier layer 132. The metal barrier recess is then filled with other metal layers, such as the work function metal layers 134-136, the metal filling layer 138 and the like. The outer surface of the metal barrier layer 132 is in contact with the spacer structures 104. The candidates for the metal barrier material include refractory metals, such as titanium (Ti), tantalum (Ta) and their nitrides, such as TiN, TaN, $W_2N$, TiSiN, TaSiN, and the like. The metal barrier layer 132 can be formed by suitable deposition process, such as PVD, CVD, ALD, metal-organic chemical vapor deposition (MOCVD) and the like.

The work function metal layers 134-136 are configured to adjust the work function of the MG electrode structure 130 and thus adjust the threshold voltage of the transistor 101. The work function metal layers 134-136 can include one or multiple layers. In the FIG. 1 example, the work function layers 134-136 include a first work function metal layer 134 and a second work function metal layer 136. The first work function metal layer 134 is formed on the metal barrier layer 132 and the second work function metal layer 136 is formed on the first work function metal layer 134. The first and second work function metal layers 134 and 136 have a U-shape at the longitudinal cross-section (e.g., along line A-A' or along the channel length) of the transistor 101. The outer surface of the first work function metal layer 134 is in contact with the metal barrier layer 132, and the outer surface of the second work function metal layer 136 is in contact with the first work function layer 134.

In some embodiments, the first work function metal layer 134 includes a mid-gap work function metal with a work function in a middle of band-gap between a conduction band and a valence band of a semiconductor material, such as silicon. The first work function metal layer 134 can be a metal layer, a metal alloy layer, multiple metal layers, and/or metal compound layers. In an example, the first work function metal layer 134 includes a metal, such as titanium nitride (TiN), tantalum nitride (TaN), cobalt (Co), titanium aluminum (TiAl), titanium aluminum carbide (TiAlC), or lanthanum oxide (La2O3).

In some embodiments, the second work function metal layer 136 includes a mid-gap work function metal with a work function in the middle of band-gap between conduction band and a valence band of a semiconductor material, such as silicon. The second work function metal layer 136 can be a metal layer, multiple metal layers, a metal alloy layer and/or metal compound layers. In an example, the second work function metal layer 136 includes a metal, such as titanium nitride (TiN), tantalum nitride (TaN), cobalt (Co), titanium aluminum (TiAl), titanium aluminum carbide (TiAlC), or lanthanum oxide (La2O3).

It is noted that the first work function metal layer 134 and the second work function metal layer 136 can be fabricated by the same material or different materials. Further, the first work function metal layer 134 and the second work function metal layer 136 can have the same thickness or different thicknesses.

In some examples, a threshold voltage of a transistor is a function of a thickness of the work function metal layers 134-136. In an embodiment, the semiconductor device 100 is manufactured to have multiple transistors with different threshold voltages. In an example, a first transistor has the first work function metal layer 134 but not the second work function metal layer 136, a second transistor has the second work function metal layer 136 but not the first work function metal layer 134, and a third transistor has both the first work function metal layer 134 and the second work function metal layer 136.

It is noted that, other suitable techniques, such as lattice matching, Fermi level pining mechanism, and the like can be suitably applied to adjust the effective work function of MG electrodes and thus adjust the threshold voltages of transistors.

The metal filling layer 138 is formed on the work function metal layers 134-136. The metal filling layer 138 has a vertical bar shape at the longitudinal cross-section (e.g., along line A-A') of the transistor 101. The work function metal layers 134-136 surround side and bottom surfaces of the metal filling layer 138. The metal filling layer 138 includes a metal having high conductivity, such as tungsten (W), copper (Cu) and the like.

The SAC hard mask structure 140 is formed on the MG electrode structure 130. The SAC hard mask structure 140 has a bar shape at the longitudinal cross section (along line A-A') of the transistor 101. The bottom of the SAC hard mask structure 140 is in contact with the metal filing layer 138 and the upper portions of the U-shape of the metal barrier 132 and the work function metal layers 134-136. The SAC hard mask structure 140 includes one or more insulator layers. In some examples, the SAC hard mask structure 140 includes silicon nitride, such as $Si_3N_4$, SiN, and other suitable N/Si ratios.

It is noted that the gate structure 103 has a T shape at the longitudinal cross section (along line A-A') of the transistor 101. For example, at the longitudinal cross section of the transistor 101, the length of the SAC hard mask structure 140 is labeled as L1, and the length of the metal structure 130 is labeled as L2. The length of the metal structure L2 is smaller than the length of the SAC hard mask structure L1 on each side by D. In an example, the thickness of the high-k layer 124 is about D. In another example, a thickness sum of the high-k layer 124 and the interfacial layer 122 is about D. The T shape is formed due to an etching process (will be discussed in detail with reference to FIG. 3 and FIG. 10) that removes the vertical portions 124' of the U-shape of the high-k layer 124 (or the high-k layer 124 and the interfacial layer 122) in an example. It is noted that, in some examples, the etching process also etches the bottom of the U-shape of the high-k layer 124, and causes undercuts at the bottom of the U-shape, as shown by 125 in the FIG. 1 example. In some examples, the width ratio (L1/L2) of the SAC hard mask structure 140 to the metal structure 130 is in the range of 1.1 to 1.4 depending on the technology and gate length L2.

The spacer structures 104 are formed on the outer surfaces of dielectric structures 120, the MG electrode structure 130 and the SAC hard mask structure 140. The spacer structures 120 are located between the gate structure 103 and the SD structures 105 in a horizontal level at the longitudinal cross-section (along A-A') along the channel length of the transistor 101. The inner surfaces of the spacer structures 104 are in contact with the outer surfaces of the dielectric structure 120, the MG electrode structure 130 and the SAC hard mask structure 140. Outer ends of the spacer structures 104 are in contact with inner ends of the SD structures 105 in some examples.

It is noted that, due to the T shape of the gate structure 103, the spacer structures 104 protrude under the SAC hard mask structure 140, and fill the space of the vertical portions 124' that were previously occupied by the high-k layer 124 (or the high-k layer 124 and the interfacial layer 122). The spacer structures 104 also fill the space of the undercuts at the bottom of the U-shape of the high-k layer 124 (and/or the interfacial layer 122).

The spacer structures 104 can be formed of one or more layers. In some embodiments, the spacer structures 104 include silicon oxide, silicon nitride, silicon oxynitride, other suitable materials, and/or combinations thereof. The spacer structures 104 are formed by suitable deposition process, such as ALD, CVD, metalorganic CVD (MOCVD), PVD, plasma enhanced CVD (PECVD), plasma enhance ALD (PEALD), combinations thereof, or other suitable techniques.

In the FIG. 1 example, each of the SD structures 105 includes a SD doped structure 161, a self-aligned silicide (SALICIDE) structure 162 and a metal contact plug 163.

The SD doped structures 161 have a conductive type associated with the channel type of the transistor 101. In some embodiments, the SD doped structures 161 are formed by an epitaxial layer. The epitaxial layer forms raised source/drain regions. In some examples, epitaxial growths can impart suitable tensile strain or compressive strain to the channel region. In some embodiments, an N-type transistor includes epitaxially grown SD doped structures 161, imparting a tensile strain to the channel region; a P-type transistor includes epitaxially grown SD doped structures 161, imparting a compressive strain to a channel region. The SD doped structures 161 have suitable doping profile.

In the FIG. 1 example, the SALICIDE structures 162 are formed on the SD doped structures 161. The SALICIDE structures 162 can be any suitable silicide, such as titanium silicide, nickel silicide, cobalt silicide, and the like. In an example, the SALICIDE structures 162 are formed by a SALICIDE process. During the SALICIDE process, a layer of a silicide forming metal, such as titanium, nickel, cobalt and the like is deposited over the entire wafer by a suitable deposition process, such as RF sputtering, CVD, PVD, and the like. Then, the wafer is given a rapid thermal anneal (RTA), to cause the deposited metal to be converted to silicide wherever the deposited metal is in direct contact with silicon, such as on the top surface of the SD doped structures 161. A selective etchant, such as hydrogen peroxide is then used to remove unreacted metal, i.e. metal that is in contact with the spacer structures 104, the top surface of SAC hard mask structure 140, and the like.

In some embodiments, the contact plugs 163 are formed in the openings above the SALICIDE structures 162. In some examples, the contact plugs 163 include any suitable conductive material, such as aluminum, copper, titanium nitride, tungsten, titanium, tantalum, tantalum nitride, TaC, TaSiN, TaCN, TiAl, TiAlN, other suitable materials, and/or combinations thereof. In some embodiments, the conductive material is blanket-deposited (e.g., by CVD) into openings above the SALICIDE structures 162. Subsequently, an etchback (e.g., dry plasma) removes excess blanket layers. In some embodiments, a planarization, such as CMP, is used to remove the excess blanket layers, and form the contact plugs 163 above the SALICIDE structures 162.

Figure 3:
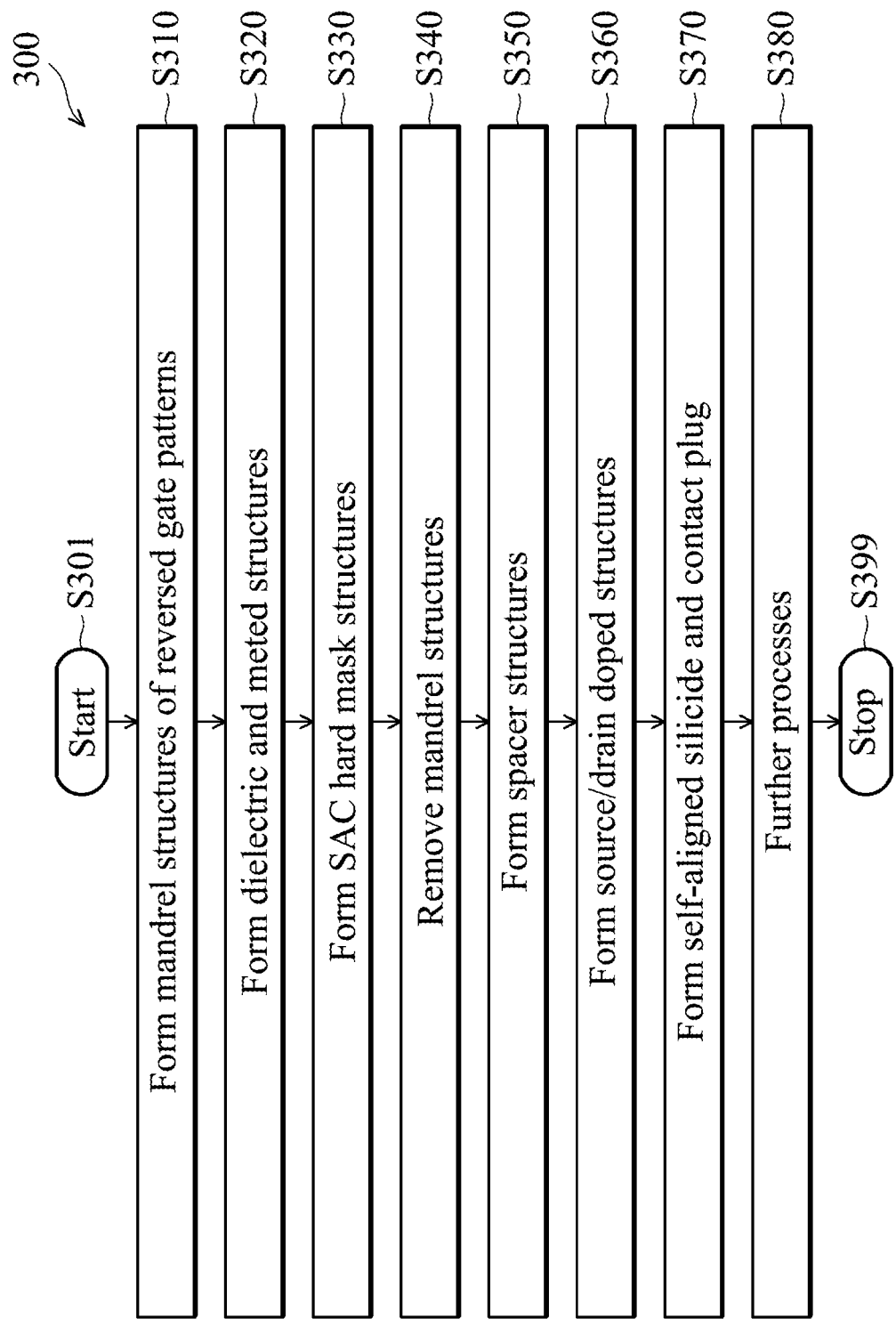
FIG. 3 shows a flow chart outlining a process 300 in accordance with some embodiments.

FIG. 3 shows a flow chart outlining a process 300 for semiconductor fabrication according some embodiments of the disclosure. In an example, the process 300 is used to fabricate the semiconductor device 100.

FIGS. 4-13 show various longitudinal cross sectional views of the semiconductor device 100 at intermediate stages during the process 300 in accordance with some embodiments.

Figure 4:
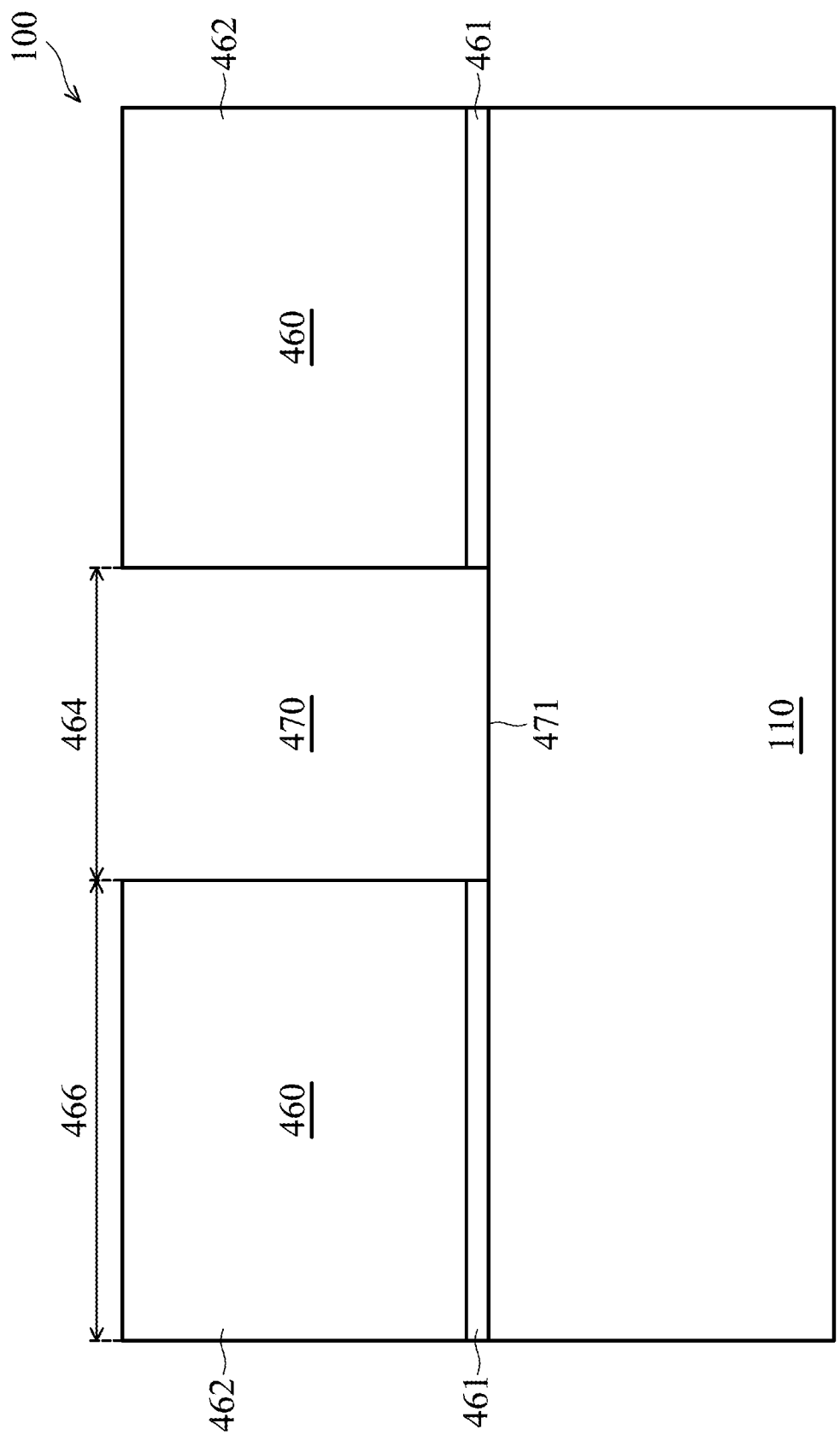
FIGS. 4-14 show various longitudinal cross sectional views of the semiconductor device 100 at intermediate stages during a semiconductor manufacturing process in accordance with some embodiments.

Referring to FIG. 3 and FIG. 4, the process starts at S301, and proceeds to S310. At S310, mandrel structures 460 are formed on the semiconductor layer 110. In some embodiments, the mandrel structures 460 have reversed gate patterns for metal gates, thus the recesses 470 that are surrounded by the mandrel structures 460 have the patterns for metal gate.

In some examples, the mandrel structures 460 are formed in a process that includes a deposition process, a photolithography process and an etching process. The deposition process forms one or more layers of material or composition over the semiconductor layer 110. In an example, the deposition process deposits a first mandrel layer 461 and a second mandrel layer 462. The first mandrel layer 461 can be for example, silicon oxide, silicon nitride, a combination thereof, or the like, and can be deposited or thermally grown according to suitable techniques. The second mandrel layer 462 can be for example, polycrystalline-silicon (polysilicon), poly-crystalline silicon-germanium (poly-SiGe), metallic nitrides, metallic silicides, metallic oxides, metals and the like. In one embodiment, amorphous silicon is deposited and recrystallized to create polysilicon. The first mandrel layer 461 and the second mandrel layer 462 can be deposited by physical vapor deposition (PVD), CVD, sputter deposition, or other suitable techniques.

In some embodiments, the photolithography process includes resist coating, soft baking, exposing, post-exposure baking, developing, and hard baking. In an embodiment, the reversed gate patterns are formed in developed photoresist, and then transferred into the first mandrel layer 461 and the second mandrel layer 462 by the etching process to form the mandrel structures. In another embodiment, the reversed gate patterns are formed in developed photoresist, and transferred into a hard mask by the etching process. Further, the hard mask is used to transfer the reversed gate patterns into the first mandrel layer 461 and the second mandrel layer 462 by the etching process to form the mandrel structures 460.

Generally, the gate patterns have relatively small feature sizes, such as a minimum gate length as shown by 464 in FIG. 4. The reverse gate patterns are of relatively large feature sizes as shown by 466 in FIG. 4. Thus, the mandrel structures 460 have relatively large feature sizes compared to the recesses 470. In a related gate-last example, mandrel structures are used to form dummy gates of the gate patterns. Further, the related gate-last example includes more planarization steps (e.g., three chemical mechanical planarization steps) that can cause gate high loss than in the present disclosure (e.g., two chemical mechanical planarization steps). Thus, the mandrel structures 460 can be fabricated with smaller height than in the related gate-last example. Then, the mandrel structures 460 have relatively large aspect ratio (width/height) compared to the mandrel structures of the dummy gates in the related gate-last example. Thus, mandrel bending and collapse issues are of less concern in the present disclosure compared to the related gate-last example.

It is noted that, in some embodiments, suitable clean process is performed, thus the semiconductor layer 110 is exposed at the bottom 471 of the recesses between the mandrel structures 460.

Figure 5:
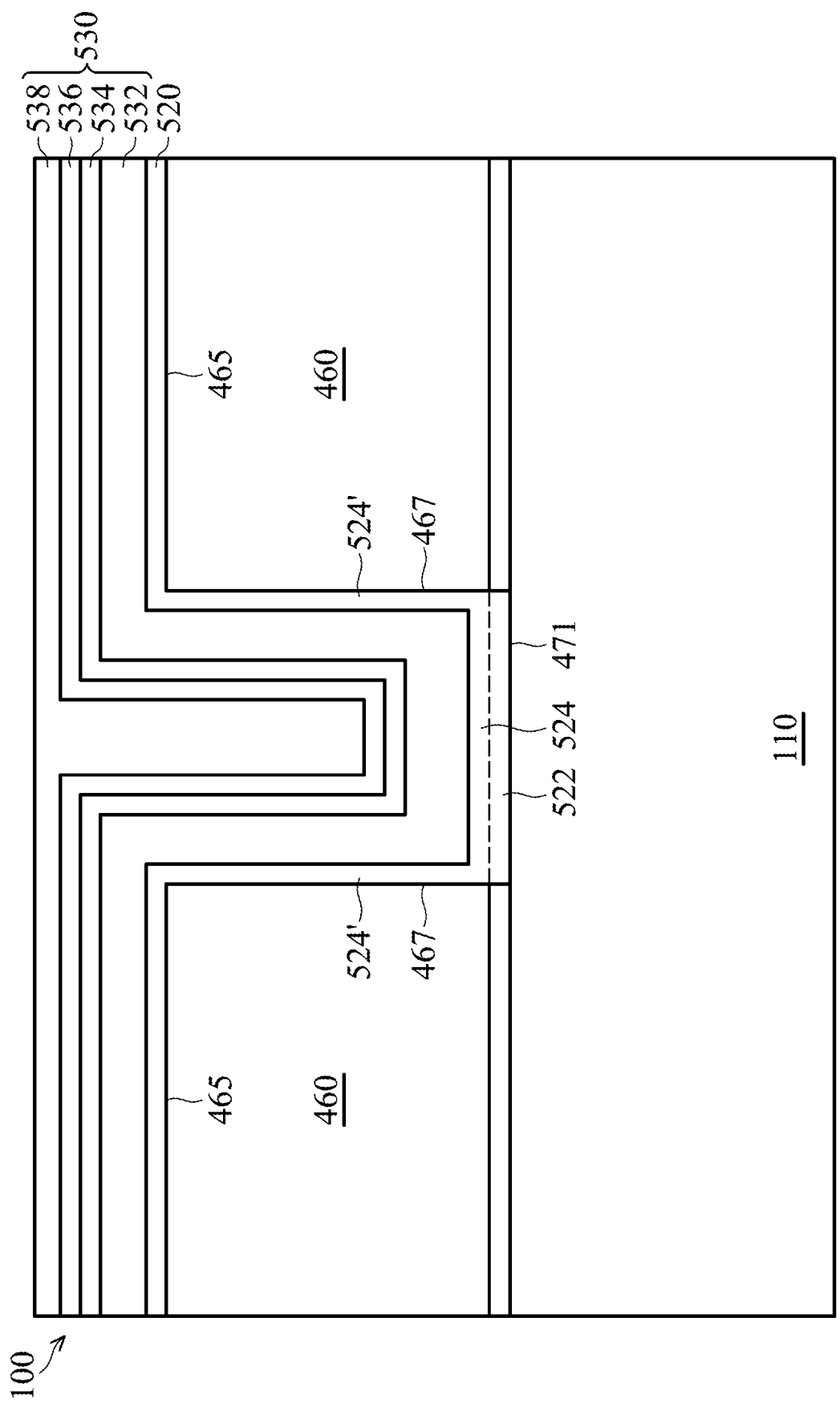
Figure 6:
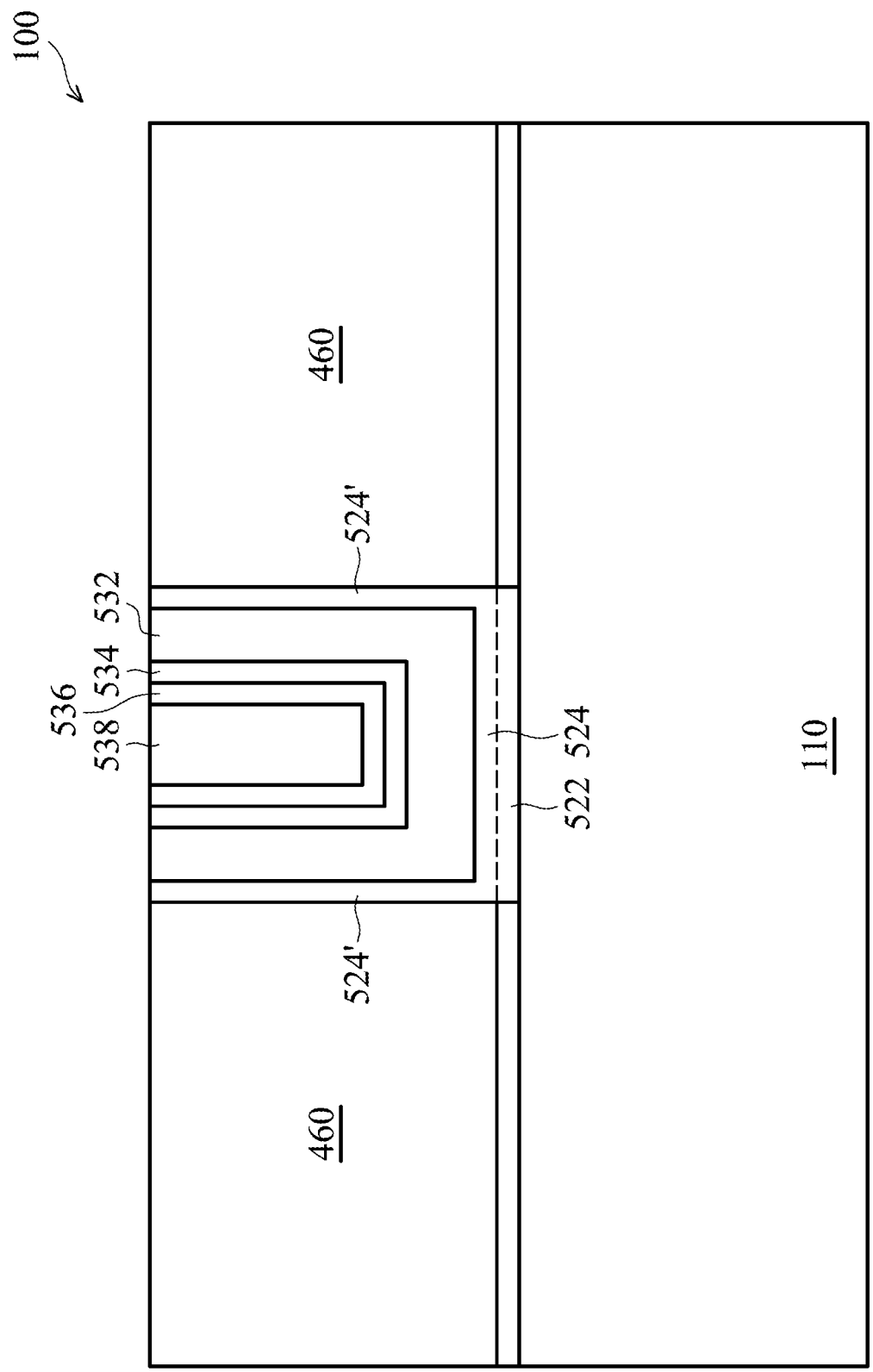

Referring to FIG. 3 and FIG. 5-6, at S320, dielectric structures and metal structures are formed. Specifically, in FIG. 5, dielectric layers 520 and metal layers 530 are formed on the surface of the semiconductor device 100 including the surface 465 of the mandrel structures 460, sidewalls 467 of the mandrel structures 460 and the bottom 471 of the recesses between the mandrel structures 460.

The dielectric layers 520 include a high-k dielectric layer 524. The high-k dielectric layer 524 is deposited on the surface 465 of the mandrel structures 460, sidewalls 467 of the mandrel structures 460 and the bottom 471 of the recesses between the mandrel structures 460. Thus, the high-k dielectric layer 524 has a U-shape in the recess between the mandrel structures 460, and the space in the U-shape is referred to as a dielectric recess. The U shape of the high-k dielectric layer 524 includes a bottom portion 524 and vertical portions 524' that contact the sidewalls 467 of the mandrel structures 460.

In some embodiments, the dielectric layers 520 include an interfacial layer 522. In an example, the interfacial layer 522 is thermally oxidized and grown dielectric (e.g., silicon dioxide), and is formed on the exposed surface of the semiconductor layer 110, such as the bottom 471 of the recesses between the mandrel structures 460 as shown in FIG. 5. In another embodiment, the interfacial layer 522 is formed by deposition, such as atomic layer deposition (ALD), chemical vapor deposition (CVD), and the like. The interfacial layer 522 in FIG. 5 is drawn according the example in which the interfacial layer 522 is thermally oxidized. The example of deposited interfacial layer 522 is not shown in FIG. 5. When the interfacial layer 522 is deposited before the high-k dielectric layer 524, and the deposited interfacial layer 522 has a U-shape in the recess between the mandrel structures 460.

In some embodiments, the high-k dielectric layer 524 is configured to have a relatively large dielectric constant compared to silicon dioxide. The high-k dielectric layer 524 can include any suitable material that provide the relatively large dielectric constant, such as hafnium oxide ($HfO_2$), hafnium silicon oxide ($HfSiO_4$), hafnium silicon oxynitride (HfSiON), aluminum oxide ($Al_2O_3$), lanthanum oxide ($La_2O_3$), tantalum oxide ($Ta_2O_5$), yttrium oxide ($Y_2O_3$), zirconium oxide ($ZrO_2$), strontium titanate oxide ($SrTiO_3$), zirconium silicon oxide ($ZrSiO_4$), hafnium zirconium oxide ($HfZrO_4$), strontium bismuth tantalate ($SrBi_2Ta_2O_9$, SBT), lead zirconate titanate ($PbZr_xTi_{1-x}O_3$, PZT), and barium strontium titanate ($Ba_xSr_{1-x}TiO_3$, BST), where x is between 0 and 1. The high-k dielectric layer 524 can be formed using any suitable deposition process, such as ALD, CVD, metalorganic CVD (MOCVD), physical vapor deposition (PVD), plasma enhanced CVD (PECVD), plasma enhance ALD (PEALD), thermal oxidation, combinations thereof, or other suitable techniques. In some examples, the thickness of the high-k dielectric layer 524 has a thickness of about 1-3 nm for 3D-FinFET device, and about 1-5 nm for planar bulk devices.

The metal layers 530 includes multiple metal layers, such as a metal barrier layer 532, work function metal layers 534-536 and a metal filling layer 538.

The metal barrier layer 532 is configured to conduct electricity and prevent inter-diffusion and reaction between metals, silicon or dielectric materials. The metal barrier layer 532 is deposited above the dielectric layers 520. The metal barrier layer 532 has a U-shape in the dielectric recess, and the space in the U-shape is referred to as a metal barrier recess. The outer surface of the U shape metal barrier layer 532 in contact with the vertical portions 524' of the dielectric layers 520. The candidates for the metal barrier material include refractory metals, such as titanium (Ti), tantalum (Ta) and their nitrides, such as TiN, TaN, W2N, TisiN, TaSiN, and the like. The metal barrier layer 532 can be formed by suitable deposition process, such as PVD, CVD, ALD, metal-organic chemical vapor deposition (MOCVD) and the like.

The work function metal layers 534-536 can include one or multiple layers. In the FIG. 5 example, the work function metal layers 534-536 include a first work function metal layer 534 and a second work function metal layer 536. The first work function metal layer 534 is formed on the metal barrier layer 532 and the second work function metal layer 536 is formed on the first work function metal layer 534. The first and second work function metal layers 534 and 536 have a U-shape in the metal barrier recess. The outer surface of the U-shape first work function metal layer 534 is in contact with the metal barrier layer 532, and the outer surface of the U-shape second work function metal layer 536 is in contact with the first work function layer 534.

In some examples, the first work function metal layer 534 includes a metal, such as titanium nitride (TiN), tantalum nitride (TaN), cobalt (Co), titanium aluminum (TiAl), titanium aluminum carbide (TiAlC), or lanthanum oxide (La2O3); and the second work function metal layer 536 includes a metal, such as titanium nitride (TiN), tantalum nitride (TaN), cobalt (Co), titanium aluminum (TiAl), titanium aluminum carbide (TiAlC), or lanthanum oxide (La2O3). In an embodiment, the second work function metal layer 536 has different thickness from the first work function metal layer 534. The first work function metal layer 534 and the second work function metal layer 536 can of the same material or different materials and can of the same thickness or different thicknesses. The work function metal layers 534-536 can be respectively deposited using suitable deposition process, such as sputtering, ALD, PVD, CVD, metal-organic chemical vapor deposition (MOCVD) and the like.

It is noted that, while the transistor 101 to be fabricated has both the first work function metal layer 534 and the second work function metal layer 536 as shown in FIG. 5, other transistors on the semiconductor device 100 can be fabricated with one of the first work function metal layer 534 and the second work function metal layer 536 by suitable patterning technology.

Further, the metal filling layer 538 is deposited above the work function metal layers 534-536 to overfill recesses between the mandrel structures 460. The metal filling layer 538 includes a metal having high conductivity, such as tungsten (W), copper (Cu) and the like. In some embodiments, a metal material, such as Al, W, WN, TaN, or Ru is sputtered and deposited to form the metal filing layer 538. In some embodiments, the metal filling layer 538 includes a composite film stack structure such as TaN, TiN, W, WN, and WCN, or any combination thereof, and can be deposited using suitable deposition process, such as sputtering, ALD, PVD, CVD, metal-organic chemical vapor deposition (MOCVD) and the like.

FIG. 6 shows a cross sectional view of the semiconductor device 100 after a planarization process. In an example, a chemical mechanical planarization (CMP) operation (referred to as first CMP step) is performed on the semiconductor device 100 after the deposition of the metal filing layer 538. The CMP operation removes the excessive materials above the mandrel structures 460, such as the excessive metal filling layer 538, the excessive work function metal layer 534-536, the excessive metal barrier layer 532, and the excessive dielectric layer 520. It is noted that a top surface of the mandrel structures 460 is also removed. It is also noted that portions of the dielectric layers 520 and the metal layers 530 remain in the recesses between the mandrel structures 460. The portion of the dielectric layers 520 remaining in the recesses between the mandrel structures 460 has the U shape that forms the dielectric recess. The portion of the metal barrier layer 532 remaining in the recess between the mandrel structures 460 has the U shape that forms metal barrier recess. The work function metals 534-536 remaining in the recesses between the mandrel structures 460 have the U shape and the portion of the metal filling layer 538 remaining in the recess between the mandrel structures 460 has the bar shape.

Referring to FIG. 3 and FIG. 7-9, at S330, SAC hard mask structures are formed.

Figure 7:
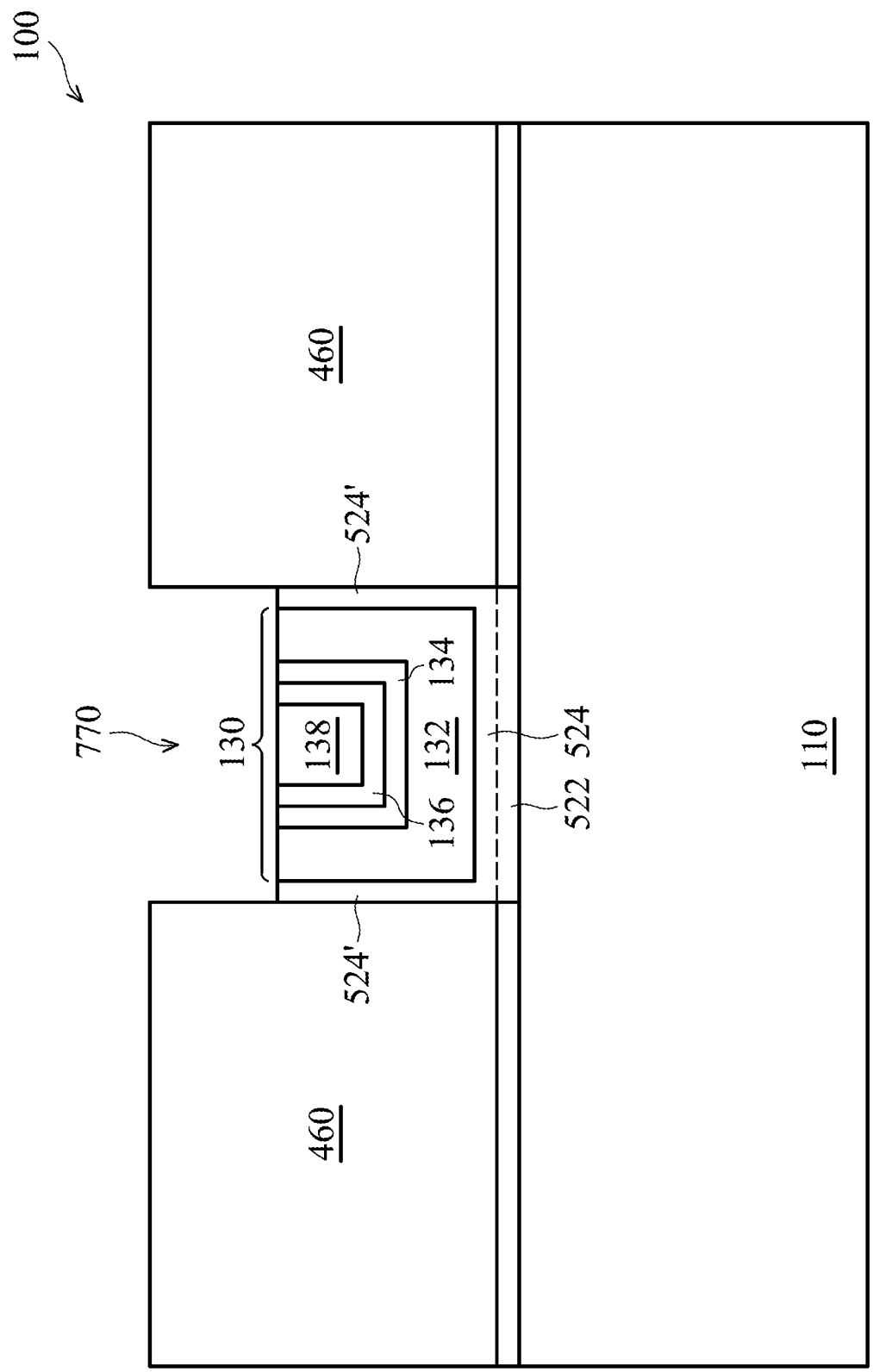

FIG. 7 shows a cross sectional view of the semiconductor device 100 after an etching back process. By the etching back process, an upper part of the metal gate (e.g., including the dielectric layers 520 and the metal layers 530 that remain in the recesses between the mandrel structures 460) is etched back to define a gate trench 770 between the mandrel structures 460. In some embodiments, the etching back process of the metal gate is a wet etching process. In some embodiments, an etchant used in the wet etching process is phosphoric acid. It is noted that after the etching back process, the MG electrode structure 130 has been formed.

Figure 8:
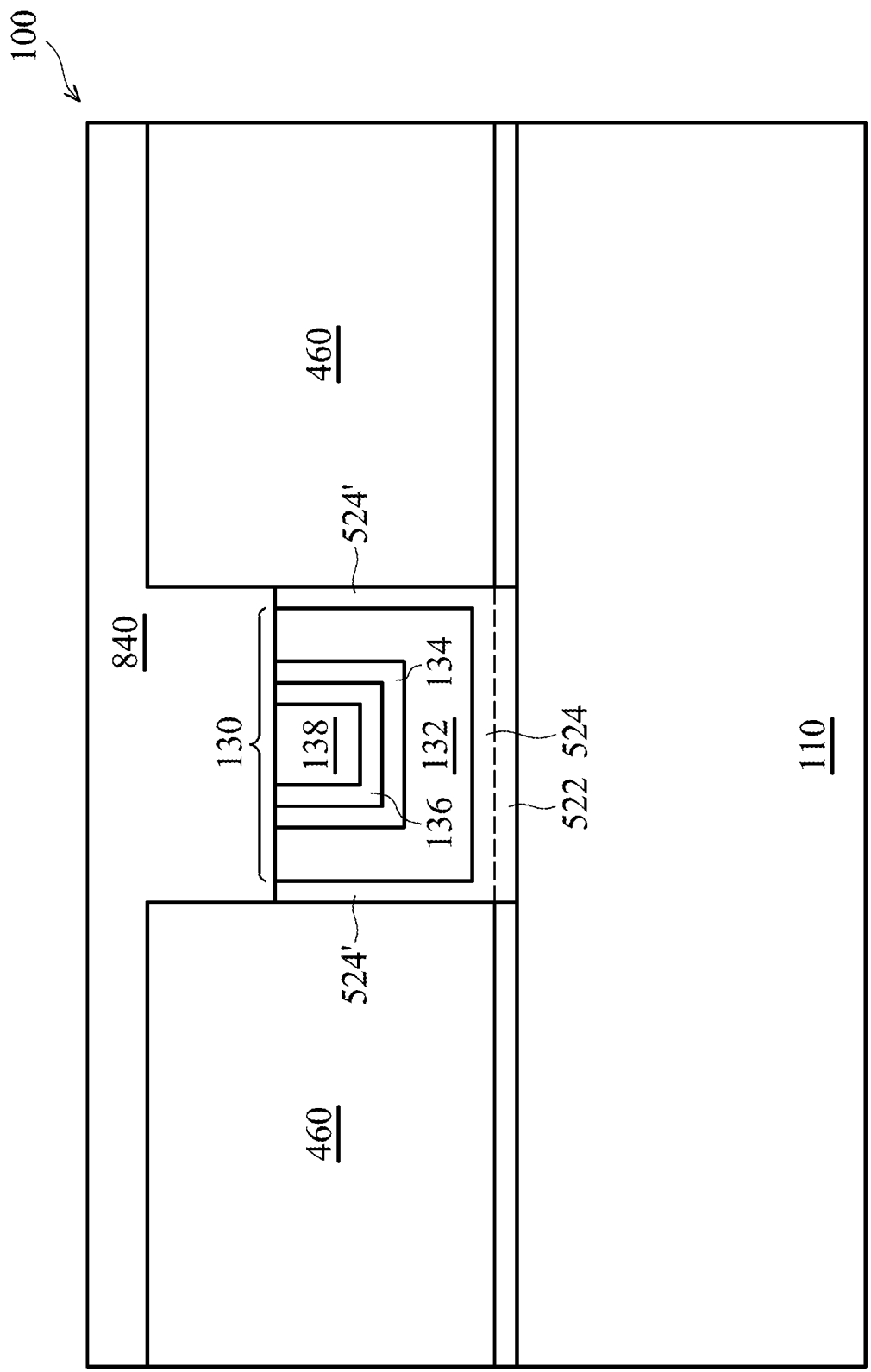

FIG. 8 shows a cross sectional view of the semiconductor device 100 after a deposition of an inter-layer dielectric (ILD) layer 840. The ILD layer 840 is used to form the SAC hard mask structure 140. In some embodiments, the ILD layer 840 includes silicon nitride, such as $Si_3N_4$, SiN, and other suitable N/Si ratios. The ILD layer 840 can be deposited by any suitable deposition process, such as CVD, PECVD, high density plasma CVD (HDPCVD), and the like.

Figure 9:
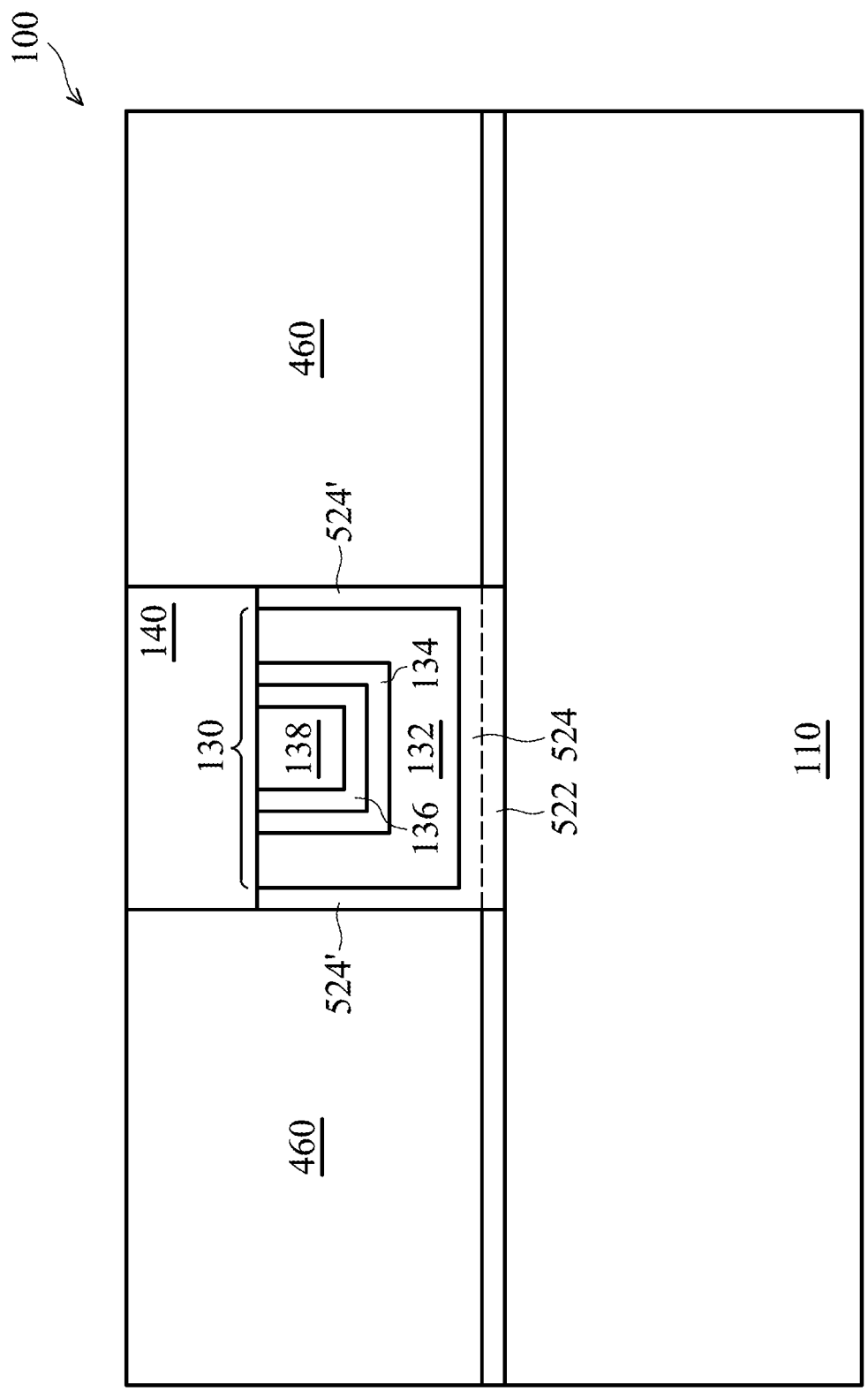

FIG. 9 shows a cross sectional view of the semiconductor device 100 after a planarization process. In an example, CMP operation (referred to as second CMP step) is performed on the semiconductor device 100 after the deposition of the ILD layer 840. The CMP operation removes the excessive ILD layer 840 above the mandrel structures 460. It is noted that a top surface of the mandrel structures 460 is also removed. It is also noted that after CMP operation, the SAC hard mask 140 has been formed.

Figure 10:
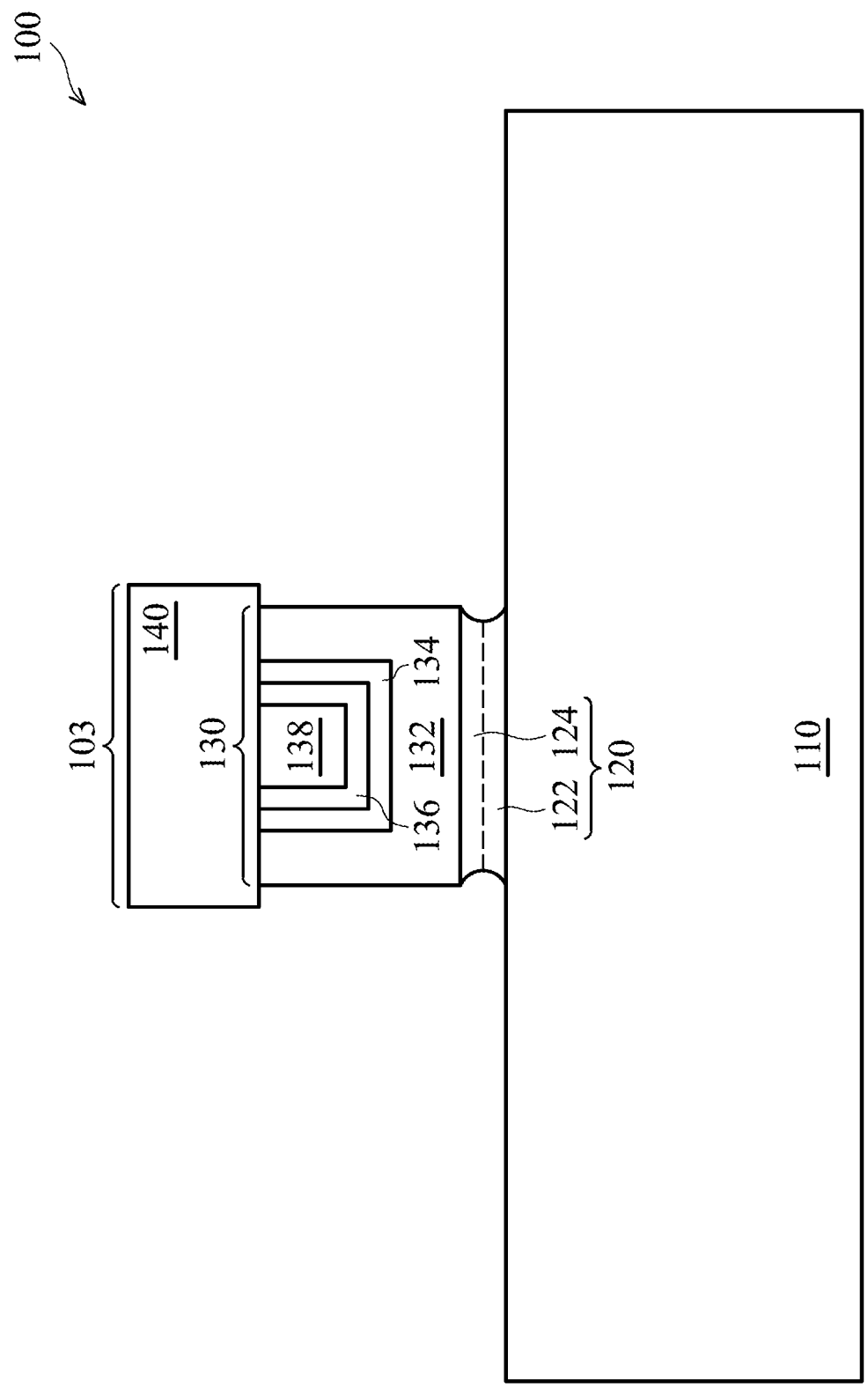

Referring to FIG. 3 and FIG. 10, at S340, mandrel structures are removed, and the gate structure 103 is formed.

FIG. 10 shows a cross sectional view of the semiconductor device 100 after an etching process that removes the mandrel structures 460. The etching process also removes the vertical portions 524' of the high-k dielectric layer 524, and undercuts the interfacial layer 122 and the high-k dielectric layer 124 to from the dielectric structure 120. In some embodiments, the etching process is an anisotropic dry etching process. For example, the etching process uses reaction gas(es) that selectively etches the mandrel structures 460, the high-k dielectric layer, the interfacial layer without etching the SAC hard mask structure 140 and the MG electrode structure 130. In some embodiments, the etching process could be a wet etching process or a combination of dry to remove mandrel while wet removing high-k and/or interfacial layer without etching the SAC hard mask structure 140 and the MG electrode structure 130.

In an wet etch example, the etchants include one or more of hydrofluoric acid (HF), buffered HF (bHF), hydrogen peroxide (H2O2), tetramethylammonium hydroxide (TMAH), dilute hydrofluoric acid and citric acid, etc. In a dry etch example, the etching gas includes nitrogen, oxygen and fluorine gas, etc. The processing duration really depends on the Mandrel thickness being used and generally the etching process is designed to have ~50-100% over-etching timing under reasonable etch selectivity.

Figure 11:
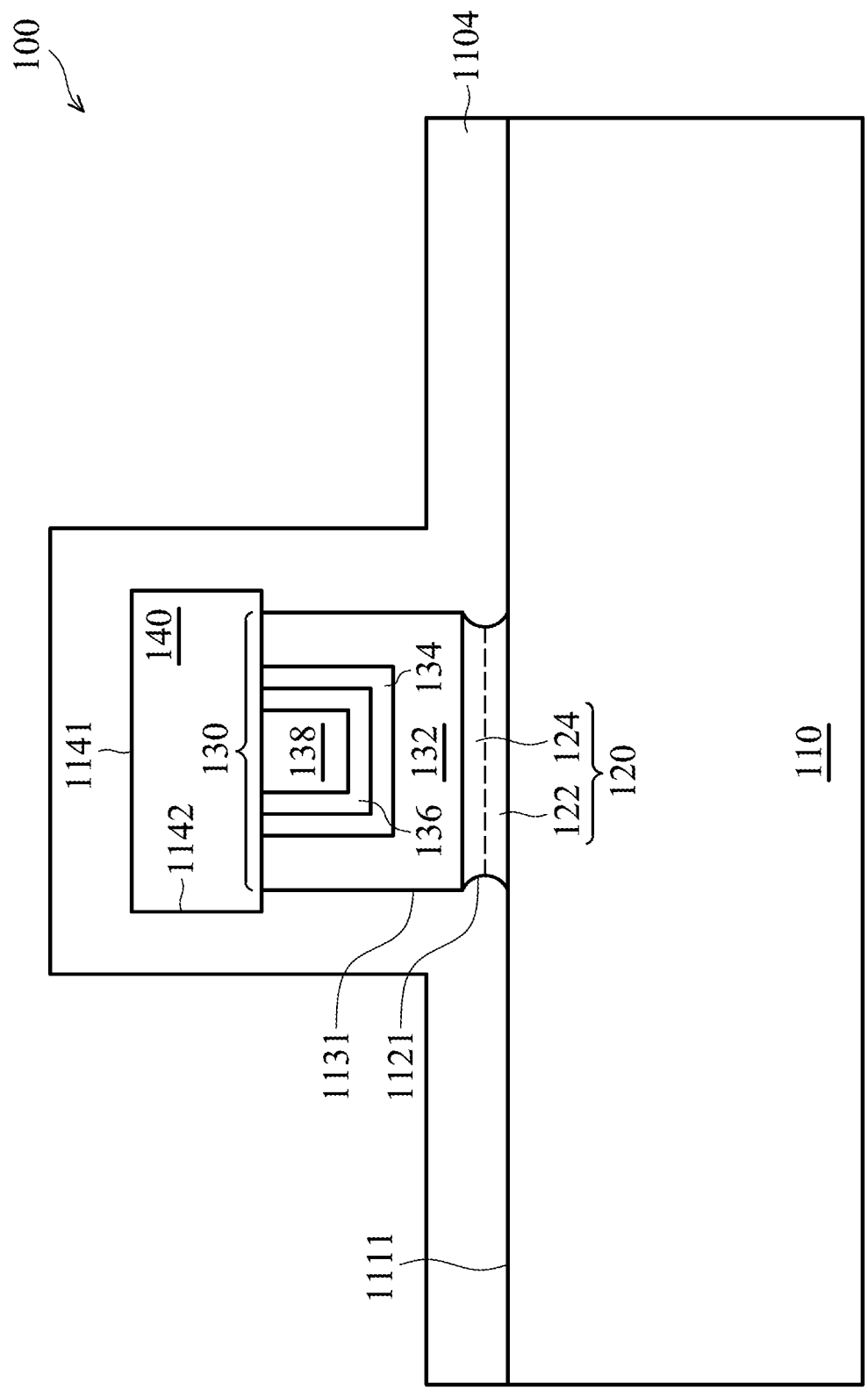
Figure 12:
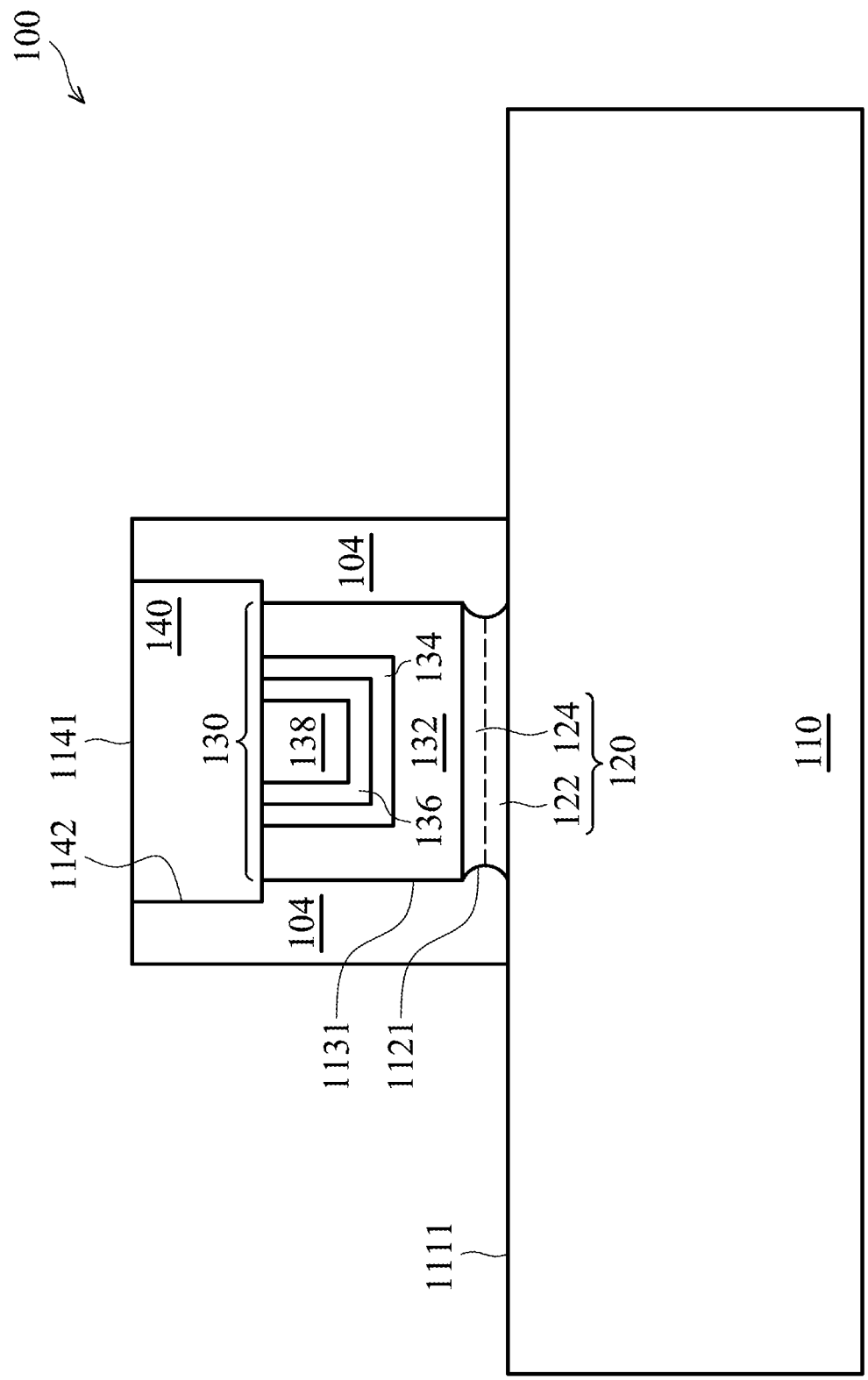

Referring to FIG. 3 and FIG. 11-12, at S350, spacer structures are formed.

FIG. 11 shows a cross sectional view of the semiconductor device 100 after a deposition of a spacer layer 1104. The spacer layer 1104 covers the surfaces of the gate structure 103, such as the top surface 1141 and sidewalls 1142 of the SAC hard mask structure 140, the outer surface 1131 of vertical portions of the metal barrier 132, the undercut portions 1121 of the dielectric structure 120, and the exposed surface 1111 of the semiconductor layer 110. The spacer layer 1104 fills the space under the SAC hard mask structure 130, the space was previously occupied by the vertical portion 524' of the high-k dielectric layer 524.

The spacer layer 1104 can include, but are not limited to, silicon oxide, silicon nitride, silicon oxynitride, other suitable materials, and/or combinations thereof. The spacer layer 1104 is deposited by suitable deposition process, such as low pressure chemical vapor deposition (LPCVD), ALD, CVD, metalorganic CVD (MOCVD), PVD, plasma enhanced CVD (PECVD), plasma enhance ALD (PEALD), combinations thereof, or other suitable techniques.

FIG. 12 shows a cross sectional view of the semiconductor device 100 after an etching process. In an example, the etching process is an anisotropic etching process that removes the spacer layer 1104 with a vertical etching speed much faster than a lateral etching speed. Thus, the spacer layer 1104 on the surface 1111 of the semiconductor layer 110, and the spacer layer 1104 on the top surface 1141 of the SAC hard mask structure 140 are removed. The spacer layer 1104 at the sidewalls 1142 of the SAC hard mask structure 140, the outer surface 1131 of vertical portions of the metal barrier 132, and the undercut portions 1121 of the dielectric structure 120 remains and forms the spacer structures 104.

Figure 13:
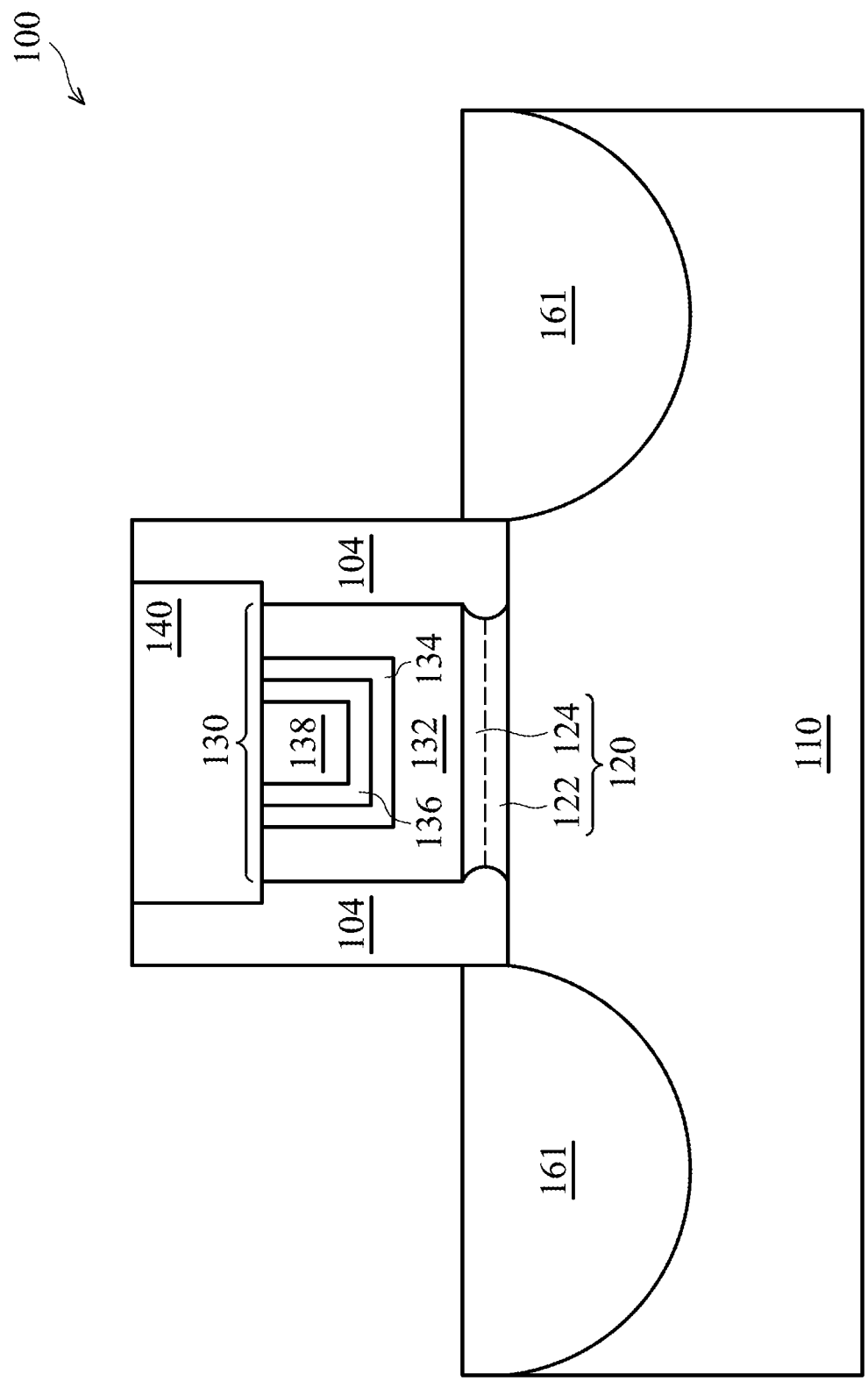

Referring to FIG. 3 and FIG. 13, at S360, SD doped structures are formed.

FIG. 13 shows a cross sectional view of the semiconductor device 100 after the SD doped structures 161 are formed. In an example, an etching process is performed to etch the semiconductor layer 110 to form source/drain recesses. In some embodiments, the spacer structures 104 and the gate structures 103 can be used as etching mask, thus the recesses are formed in the source/drain regions. Then, an epitaxial process is performed to grow epitaxial layer at the source/drain recesses to form the SD doped structures 161. The SD doped structures 161 are suitably doped during the epitaxial process. In some examples, suitable strain is imparted in the channel region during the epitaxial process.

Figure 14:
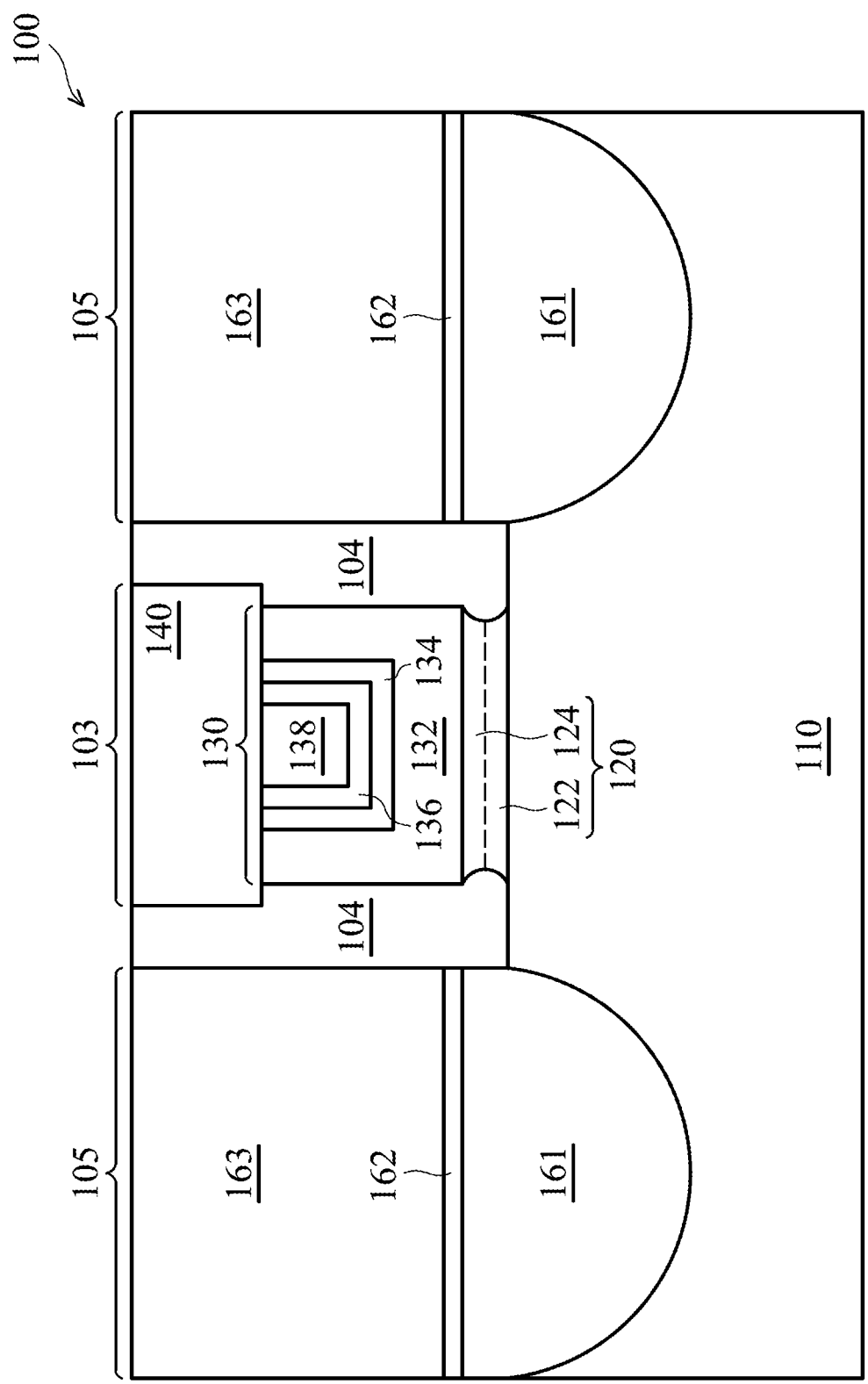

Referring to FIG. 3 and FIG. 14, at S370, the SALICIDE structures and the contact plugs are formed.

FIG. 14 shows a cross sectional view of the semiconductor device 100 after the SD structures 105 are formed, which is the same as the semiconductor device 100 shown in FIG. 1.

In an example, during a SALICIDE process, a layer of a silicide forming metal, such as titanium, nickel, cobalt and the like is deposited over the entire wafer by a suitable deposition process, such as RF sputtering, CVD, PVD, and the like. Then, the wafer is given a rapid thermal anneal (RTA), to cause the deposited metal to be converted to silicide wherever the deposited metal is in direct contact with silicon, such as on the top surface of the SD doped structures 161 to form the SALICIDE structure 162. A selective etchant such as hydrogen peroxide is then used to remove unreacted metal, i.e. metal that is in contact with the spacer structures 104, the top surface of SAC hard mask structure 140, and the like.

In some embodiments, the contact plugs 163 are formed in the openings above the SALICIDE structures 162. In some examples, the contact plugs 163 include any suitable conductive material, such as aluminum, copper, titanium nitride, tungsten, titanium, tantalum, tantalum nitride, TaC, TaSiN, TaCN, TiAl, TiAlN, other suitable materials, and/or combinations thereof. In some embodiments, the conductive material is blanket-deposited (e.g., by CVD) into openings above the SALICIDE structures 162. Subsequently, an etching back process (e.g., dry plasma) removes some excess blanket layers. In some embodiments, a planarization, such as CMP, is used to remove the excess blanket layers.

Referring to FIG. 3, at S380, further processes are subsequently performed on the semiconductor device 100, such as gate-cut, forming back-end-of-line structures, and the like. Referring to FIG. 3, the process 300 then proceeds to S399 and terminates.

It is noted that during the process 300, two CMP process steps (first CMP step and second CMP step) can cause gate height loss. In a related gate-last process, mandrel structures are used to form dummy gate. The related gate-last process includes three CMP process steps that can cause gate height loss. The mandrel structures in the present disclosure can be fabricated initially with a smaller height than in the related gate-last process. Further, the mandrel structures in the present disclosure are of the reversed gate patterns, and thus have relatively large width than the related gate-first process. Thus, the mandrel structures in the present disclosure have relatively large aspect ratio compared to the related gate-last example, and mandrel structure bending and collapse issues are of less concern in the present disclosure.

It is also noted that the gate-first process in the present disclosure uses metal filling techniques to pattern gate and thus can achieve straighter gate profile, dual metal patterning, no metal etching and the like. In addition, in some embodiments, the gate-first process allows a self-aligned formation of source/drain structures. It is also noted that the gate-first process is generally compatible with regular logic CMOS process, and can be more easily integrated into a manufacture facility that uses regular logic CMOS process.

Aspects of the disclosure provide a semiconductor device. The semiconductor device includes a gate structure, a spacer structure and a source/drain structure that are formed on a surface of the semiconductor layer. The gate structure includes a dielectric structure, a metal structure and an insulator structure. The dielectric structure is formed on the surface of the semiconductor layer. A bottom of the metal structure contacts a top of the dielectric structure. The bottom of the insulator structure contacts a top of the metal structure and the insulator structure protrudes over the top of the metal structure. The spacer structure is configured to extend underneath the bottom of the insulator structure and contact a sidewall of the metal structure. The spacer structure is configured to space between the gate structure and the source/drain structure. The source/drain structure includes a source/drain doped structure in the semiconductor layer, a silicide structure on a surface of the source/drain doped structure and a metal contact plug formed on the silicide structure.

Aspects of the disclosure also provide a method for semiconductor manufacturing. The method includes forming mandrels on a semiconductor layer with a recess that is surrounded by the mandrels and forming, in the recess, a gate structure. The gate structure includes a dielectric structure on a surface of the semiconductor layer, a metal structure on the dielectric structure, and an insulator structure on the metal structure. Further, the method includes removing the mandrels, forming a spacer structure that spaces between the gate structure and a source/drain structure, and forming the source/drain structure adjacent to the spacer structure.

Aspects of the disclosure provide a semiconductor device having a semiconductor fin. The semiconductor device includes a gate structure, and a spacer structure. The gate structure is formed at a region of the semiconductor fin. The gate structure includes a dielectric structure that is formed on sidewalls and a top surface of the semiconductor fin, a metal structure that covers the dielectric structure on the sidewalls and the top surface of the semiconductor fin and an insulator structure that covers the metal structure, and extends beyond the metal structure. The spacer structure is configured to extend underneath the insulator structure and contact a sidewall of the metal structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for semiconductor manufacturing, comprising:
   forming mandrel structures on a semiconductor layer with a recess that is surrounded by the mandrel structures;
   forming, in the recess, a gate structure that includes
      a dielectric structure on a surface of the semiconductor layer, wherein forming the gate structure further comprises depositing a dielectric layer with a first portion on a bottom surface of the recess and a second portion lining sidewalls of the mandrel structures to form a dielectric recess that is surrounded by the dielectric layer,
      a metal structure on the dielectric structure, and
      an insulator structure on the metal structure;
   removing the mandrel structures, wherein removing the mandrel structures further comprises etching the mandrel structures to remove the mandrel structures and the second portion of the dielectric layer that lines the sidewalls of the mandrel structures;
   forming a spacer structure that spaces between the gate structure and a source/drain structure, wherein forming the spacer structure further comprises depositing a spacer layer that fills in a space that is underneath the insulator structure and was previously occupied by the second portion of the dielectric layer, the second portion of the dielectric layer being removed by the etching of the mandrel structures; and
   forming the source/drain structure adjacent to the spacer structure.

2. The method of claim 1, wherein depositing the dielectric layer further comprises:
   depositing the dielectric layer with a dielectric constant that is higher than 3.9.

3. The method of claim 1, further comprising:
   depositing metal layers that fill the dielectric recess; and
   performing a planarization to remove excessive metal layers and the dielectric layer on the mandrel structures.

4. The method of claim 3, further comprising:
   etching an upper portion of the metal layers in the recess to form a trench above the metal layers; and
   forming the insulator structure in the trench.

5. The method of claim 1, wherein depositing the spacer layer further comprises:
   depositing the spacer layer that fills in an undercut space in the first portion of the dielectric layer.

6. The method of claim 1, wherein forming the source/drain structure adjacent to the spacer structure further comprises:
   etching, using the spacer structure and the gate structure as a mask, to create a source/drain recess in the semiconductor layer;
   growing an epitaxial layer in the source/drain recess with a doping profile to form a source/drain doped structure.

7. A method for semiconductor manufacturing, comprising:
   forming mandrel structures on a semiconductor layer with a recess that is surrounded by the mandrel structures, wherein the mandrel structures includes a first mandrel layer over the semiconductor layer and a second mandrel layer over the first mandrel layer;
   forming a gate structure in the recess;
   removing the mandrel structures and a lower portion of the gate structure;
   forming a spacer over a sidewall of the gate structure; and
   forming a source/drain structure over the semiconductor substrate, wherein the spacer is between the source/drain structure and the gate structure.

8. The method of claim 7, wherein the gate structure has a T shape after a lower portion of the gate structure is removed.

9. The method of claim 7, wherein forming a gate structure in the recess comprises:
   forming a dielectric layer on the semiconductor layer;
   forming a metal layer on the dielectric layer; and
   forming a hard mask structure on the metal layer.

10. The method of claim 9, wherein forming the dielectric layer on the semiconductor layer comprises:
    forming an interfacial layer on the semiconductor layer; and
    forming a high-k dielectric layer on the interfacial layer and opposite sidewalls of the first mandrel layer and the second mandrel layer.

11. The method of claim 10, wherein removing the first mandrel layer, the second mandrel layer and the lower portion of the gate structure comprises:
    etching the first mandrel layer, the second mandrel layer and a vertical portion of the high-k dielectric layer; and
    recessing the interfacial layer and a horizontal portion of the hi-k dielectric layer.

12. The method of claim 11, wherein forming the metal layer on the dielectric layer comprises:
    forming a metal barrier layer on the dielectric layer;
    forming a work function metal layer on the metal barrier layer; and
    forming a metal filling layer on the work function metal layer.

13. The method of claim 12, wherein the spacer covers the metal barrier layer, the interfacial layer and the horizontal portion of the high-k dielectric layer.

14. The method of claim 13, wherein forming the hard mask structure on the metal layer comprises:
 forming an inter-layer dielectric layer on the second mandrel layer, the dielectric layer and the metal layer; and
 removing a portion of the inter-layer dielectric layer above the second mandrel layer.

15. A method for semiconductor manufacturing, comprising:
 forming a dielectric layer over a semiconductor layer;
 forming a metal layer over the dielectric layer;
 forming a hard mask structure over the metal layer;
 removing a vertical portion of the dielectric layer to expose the metal layer, wherein the vertical portion of the dielectric layer is covered by the hard mask structure before being removed;
 recessing a horizontal portion of the dielectric layer to form a dielectric structure, wherein the dielectric structure, the metal layer and the hard mask structure form a gate structure; and
 forming a spacer over a sidewall of the gate structure.

16. The method of claim 15, wherein a first width of the hard mask structure is greater than a second width of the metal layer.

17. The method of claim 16, wherein the second width of the metal layer is greater than a third width of the dielectric structure.

18. The method of claim 15, wherein a sidewall of the vertical portion of the dielectric layer is substantially aligned with a sidewall of the hard mask structure before being removed.

19. The method of claim 15, wherein a top surface of the vertical portion of the dielectric layer is in direct contact with a bottom surface of the hard mask structure before being removed.

20. The method of claim 15, wherein a first width of the hard mask structure is greater than a second width of the metal layer before the vertical portion of the dielectric layer is removed.

* * * * *